United States Patent [19]

Kazmierski et al.

[11] Patent Number: 5,306,923
[45] Date of Patent: Apr. 26, 1994

[54] OPTOELECTRIC DEVICE WITH A VERY LOW SERIES RESISTANCE

[75] Inventors: Christophe Kazmierski, Morangis; Benoit Rose, Paris, both of France

[73] Assignee: France Telecom, Paris, France

[21] Appl. No.: 980,263

[22] Filed: Nov. 23, 1992

[30] Foreign Application Priority Data

Dec. 4, 1991 [FR] France .................. 91 15000

[51] Int. Cl.⁵ .......................... H01L 29/161
[52] U.S. Cl. ................... 257/14; 372/45; 372/46; 257/101
[58] Field of Search ........ 257/96, 101, 13, 14, 257/98; 372/45, 46

[56] References Cited

U.S. PATENT DOCUMENTS

| | | |
|---|---|---|
| 4,371,967 | 2/1983 | Wada et al. . |
| 4,479,222 | 10/1984 | Hawrylo ................. 372/44 |
| 5,177,757 | 1/1993 | Tsugami .................. 372/45 |
| 5,189,680 | 2/1993 | Kimura ................... 372/45 |
| 5,212,705 | 5/1993 | Kahan et al. ............ 372/45 |
| 5,214,663 | 5/1993 | Kakimoto et al. ....... 372/45 |

FOREIGN PATENT DOCUMENTS

| | | |
|---|---|---|
| 0380322 | 8/1990 | European Pat. Off. . |
| 1228684 | 10/1986 | Japan . |
| 1-007667 | 1/1989 | Japan . |
| 4-100288 | 2/1992 | Japan ..................... 372/45 |

OTHER PUBLICATIONS

IEEE Journal of Quantum Electronics, vol. 27, No. 6, Jun. 1991 pp. 1794–1797–C. Kazmierski et al.
Japanese Journal of Applied Physics, vol. 25, No. 8, Aug. 1986 pp. 1169–1173–K. Kazmierski et al.

*Primary Examiner*—Andrew J. James
*Assistant Examiner*—Courtnay A. Bowers
*Attorney, Agent, or Firm*—Cesari and McKenna

[57] ABSTRACT

An optoelectronic device with a very low series resistance has a III-V substrate, a lower, n-doped III-V material semiconducting confinement layer placed on the substrate, an active zone having at least one active, not intentionally doped III-V material semiconducting layer placed on the lower confinement layer, an upper, p-doped III-V material semiconducting confinement layer covering said active zone, the forbidden energy band of the active layer being lower than that of the confinement layers. Two metal coatings are placed on two opposite faces of the device and there is a highly n-doped, quaternary III-V material semiconducting layer for stopping the diffusion of doping ions from the upper confinement layer and placed between the active layer and the upper confinement layer, said stopping layer having a thickness smaller than that of the active layer and also forming part of the active zone.

8 Claims, 2 Drawing Sheets

ОПТОELECTRIC DEVICE WITH A VERY LOW SERIES RESISTANCE

DESCRIPTION

The invention relates to a semiconductor, very low series resistance optoelectronic device. It applies to the field of lasers, modulators and other semiconductor devices having a double heterostructure for the transmission of information, which may or may not be guided by the optical fiber.

More specifically, these applications apply to lasers having a high power and efficiency level more particularly usable in the fields of photochemistry, telecommunications, television, data processing and telemetry.

This device uses as the semiconductor material compounds based on III and V elements of the periodic classification of elements.

A double heterostructure is constituted by a semiconductor layer having a low forbidden energy band, called the active layer, surrounded on each side by semiconductor layers having a wider forbidden energy band and which fulfil the double function of optical and electrical confinements.

Typical examples of double heterostructures are a GaAs layer between two $Ga_aAl_{1-a}As$ alloy layers with $0 < a \leq 1$ for emission at 0.8 μm and a $Ga_bIn_{1-b}As_cP_{1-c}$ alloy layer with $0 \leq b \leq 1$ and $0 \leq c \leq 1$ between two InP layers for emission at 1.3 or 1.5 μm.

These semiconductor material layers are deposited on GaAs or InP substrates by one of the following conventional growth methods: chemical or molecular beam, gas or liquid phase epitaxy.

The active layer has the geometrical shape of a ribbon, which guides the emission of light with an optical feedback due to reflections on mirrors constituted by cleaved or etched faces perpendicular to the ribbon, or by periodic networks introducing an index disturbance into the laser ribbon.

Two metal coatings on either side of the stack of semiconductor layers complete the laser structure.

Potentially, semiconductor laser devices can be very powerful and respond very rapidly to electrical interference and disturbances, their performance characteristics often being limited by the series resistance associated with the structure of the device. Consequently, the series resistance causes an increase in the heat losses and a reduction in the static performance characteristics of the device, such as the threshold current, the quantum electron-photon conversion efficiency, the optical power and, in the case of lasers, the source efficiency. Moreover, the dynamic performance characteristics are dependent on the series resistance by means of the RC product of the device, which limits the passband.

With advances in telecommunications, television and data processing, the volume of information exchanged and the transmission distances increase very rapidly. One of the solutions for ensuring the transmission and distribution of information is fiber optics communications (earth channel) or by satellite (space channel), which makes use of very powerful and/or very fast lasers.

The generally adopted solutions are aimed at optimizing the optical behavior of the component, which makes it necessary to dope the semiconductor material and therefore introduces a series resistance. Generally the active layer is not intentionally doped. In addition, one of the confinement layers is n-doped, while the other confinement layer is p-doped, in order to form a p-n junction.

The series resistance of a double heterostructure electronic device with a p-n junction as in the BRS laser (Buried Ridge Stripe published e.g. in the article by J.C. Bouley et al in Proceedings of the 9th IEEE International Semiconductor Laser Conference "1.55 μm strip buried Schottkey laser", p.54, August 1984) is essentially limited by the series resistance between the metallization electrodes and their interfaces with the semiconductor and by the conductivity of the semiconductor layers.

A considerable effort has been made to reduce the electrical resistance of metal coatings. As this reistance has at present become comparable to that of semiconductor layers, it would also be effective to act on the resistance of the semiconductor layers.

One obvious procedure would be to increase the doping level, more particularly on the p-side of the p-n junction, as the p-material is more resistive because the mobility of the holes is up to 100 times less than that of the electrons. However, it has been demonstrated, e.g. by Sasaki et al (Journal of Crystal Growth 93(1988), pages 838-842, "Doping optimization in InGaAsP DH Lasers and improved characteristics in BH lasers grown by MOVPE"), that an increase in the p-doping beyond $5 \times 10^{17}$ ions/cm$^3$ leads to a significant deterioration in the characteristics of laser devices. This performance loss has been attributed to the diffusion of the p-dopant (in this case Zn) into the active layer.

Little research has been published up to now regarding the possibility of using a very high p-doping, probably because the acceptor diffusion phenomenon during the growth of the active layer is approximately 200 nm, so that it would be necessary to control the diffusion to within roughly 20 nm.

However, certain efforts have been made to avoid the diffusion of zinc into the laser active layer. Y.L. Wang et al published in Applied Physics Letters 57 (October 1990), p.1864 "Buried-heterostructure lasers fabricated by in situ processing techniques", a laser structure produced by molecular beam epitaxy, having an additional, not intentionally doped (n-type) InP layer, inserted between the active, not intentionally doped InGaAsP layer and the p-doped InP confinement layer. This additional layer serves to space the active layer precisely at the zinc diffusion distance during the deposition of the p layer.

A study of the diffusion of zinc under epitaxial growth conditions was necessary to precisely determine the thickness of the supplementary layer or spacer.

The same idea of a spacing InP layer was reported by Sasaki in the aforementioned article.

Conventionally, laser structures with optimized optoelectronic performance characteristics have a series resistance between 4 and 10 ohms for an approximately 300 μm long structure, such as e.g. that of a BRS laser described by P. Devoldere et al. in IEEE Proceedings, J, Vol. 136, No. 1 (1989), pp. 76-82 "Lasers on semi-insulating InP substrate".

At present, the not intentionally doped InP separating or spacing layer would appear to be the only means used in optoelectronic device structures for preventing the deterioration of the active layer by the diffusion of acceptors from a low resistivity (i.e. highly doped) layer, which is increased at the epitaxial growth temperature. However, this method does not eliminate the problem of controlling or checking the position of the p-n junction, because there is still chemical diffusion from the acceptor into the separating layer.

Another practical disadvantage is the need to adjust the thickness of the separating layer whenever there is a change in the growth method or conditions, the semiconductor material or the structure. These problems make it very difficult to use very high doping levels necessary for obtaining a low series resistance.

The aim of the invention is to propose an optoelectronic device structure with a modified stack of semiconductor layers making it possible to obviate the above problems. This device has a low series resistance without any deterioration of the threshold current and the quantum electron-photon conversion efficiency.

The proposed semiconductor structure has the advantage of a better control of the position of the p-n junction, independently of the epitaxy method and conditions and, compared with the prior art, makes it possible to control higher doping levels.

More specifically, the present invention relates to an optoelectronic device having a III-V substrate, a lower, n-doped III-V material semiconductor confinement layer in contact with the substrate, an active zone having at least one not intentionally doped III-V material semiconductor layer located on the lower confinement layer, an upper, p-doped III-V material semiconductor confinement layer covering the active zone, the forbidden energy band of the active layer being below that of the confinement layers, a first metal coating placed on the upper confinement layer and a second metal coating placed on the substrate, said device being characterized in that it comprises, between the active layer and the upper confinement layer, a strongly n-doped, quaternary III-V material semiconductor layer stopping the diffusion of doping ions from the upper confinement layer, said stopping layer having a thickness smaller than that of the active layer and also forming part of the active zone.

The term highly doped is understood to mean doping above $10^{17}$ ions/cm$^3$.

The invention is applicable to all III-V material types. In particular, the element III is chosen from among aluminum, gallium and indium and the element V from among phosphorus, arsenic or antimony. In addition, the semiconductor layers can be of binary, ternary or quaternary material. In particular, the substrate is of GaAs or InP.

The active layer can be made from a single material or can be constituted by a stack of layers forming an active structure known as a "quantum well structure", i.e. a structure having alternate thin layers of two material types, one having a forbidden energy band which is below that of the other.

On either side of said active layer, it is possible to use a layer having a gradual composition, whose surface in contact with the active layer has the same composition as the latter and whose surface in contact with the upper confinement layer has the same composition as the latter. If necessary, it is possible to use a layer for protecting the active zone positioned between the upper confinement layer and the first metal coating.

According to the invention, the quaternary stopping layer can have a composition identical or different from that of the layers forming the active layer. It will generally have a composition identical to that of one of the layers forming the active layer. For a GaAs substrate, the stopping layer can be $Ga_{1-d}Al_dAs_{1-e}P_e$ with $0 \leq d < 1$ and $0 \leq e < 1$.

The device according to the invention is particularly suitable for BRS-type lasers, where the substrate is of InP. On such a substrate, it is advantageous to use a lower n-doped, InP confinement layer, an active $Ga_{1-x}In_xAs_{1-y}P_y$ layer with $0 \leq x \leq 1$ and $0 \leq y \leq 1$, which is not intentionally doped, a lower p$^+$-doped InP confinement layer and a n-doped diffusion stopping layer of $Ga_{1-z}In_zAs_{1-t}P_t$ with $0 < z < 1$ and $0 < t < 1$.

Obviously, x,y,z and t are chosen in such a way that the active layer has a forbidden energy band below that of the confinement layers.

In this type of structure, the high p-doping in the n-InP/p-InP junction of the two sides of the active zone acts in the sense of reducing lateral leakage currents and improving the confinement of the laser current in the active layer.

Advantageously, the quaternary layer is doped at a donor ion concentration equal to or above that of the acceptor ions of the upper confinement layer and in particular at a donor doping ion concentration of $5.10^{17}$ to $5.10^{18}$ ions/cm$^3$.

BRIEF DESCRIPTION OF THE DRAWINGS

The invention is described in greater detail hereinafter relative to non-limitative embodiments and with reference to the attached drawings, wherein show.

In the following description, the examples given correspond to a structure using the InP semiconductor, but it is obvious that the invention is not limited to this case.

Figure 1:
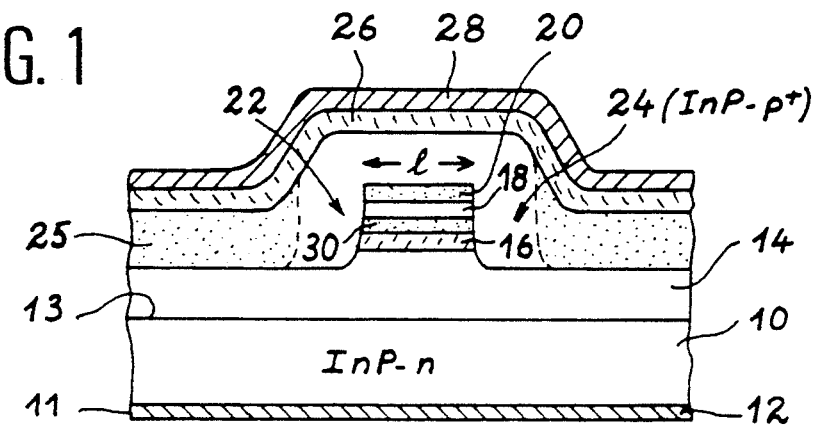
FIG. 1, diagrammatically and in cross-section, a laser structure according to the invention.

FIG. 1 shows in cross-section, a BRS-type laser structure according to the invention. There is a stack of layers similar to that encountered in known laser structures. This structure has a n-type (silicon doped) InP substrate 10 with a doping ion concentration of approximately $5.10^{18}$ ions/cm$^3$, an AuTi metal coating 12 on its lower surface 11 and a lower confinement layer of buffer layer 14 on its upper face 13. The buffer layer 14 is of InP n-doped at a concentration of $5 \times 10^{17}$ to $3 \times 10^{18}$ silicon ions/cm$^3$ and has a thickness of 0.5 to 2.0 $\mu$m.

This buffer layer 14 supports an active layer 16. The layer 16 is e.g. of solid, not intentionally doped, quaternary $Ga_{1-x}In_xAs_{1-y}P_y$ material with $0 < x < 1$ and $0 < y < 1$. The residual doping is of type n with a concentration of approximately $10^{16}$ ions/cm$^3$. The layer thickness is approximately 15 nm. The composition of the active layer 16 can be adjusted as a function of the chosen emission wavelength and in particular so that the laser emits in the range 1.5 or 1.3 $\mu$m.

Emission at 1.5 $\mu$m corresponds to x approximately 0.6 and y approximately 0.1 and an emission at 1.3 $\mu$m corresponds to x of approximately 0.75 and y approximately 0.5.

It is also possible to produce the active layer 16 in the form of a "quantum well" structure constituted by a stack of not intentionally doped (residual n-type) $Ga_{1-u}In_uAs/Ga_{1-x}In_xAs_{1-y}P_y$ layers, with $0 \leq u \leq 1$ and x and y having the values given above. The GaInAs layers constitute the quantum wells. The GaInAsP layers serve as an optical guide and can have a constant or gradual composition. The layers used as an optical guide have a forbidden band width exceeding that of the layers serving as quantum wells. These quantum well structures are also known under the name grating structure.

In particular, it is possible to use a structure having three quantum wells 7 nm thick and with an indium composition u of 0.53 and with 4 optical guides having a constant indium and phosphorus composition with x 0.75 and y 0.5 and a thickness of 10 nm.

In known manner, the laser structure can optionally have one or more layers 18 in contact with the active layer made from $Ga_{1-v}In_vAs_{1-w}P_w$ with $0 \leq v \leq 1$ and $0 \leq w \leq 1$, which is not intentionally doped (residual n-type) and having a forbidden band width greater than that of the active layer 16, when the latter is of solid GaInAsP, said layers alternating with not intentionally doped InP layers. This structure constitutes a periodic Bragg grating of distributed mirrors. A laser equipped with such a Bragg grating is known as a DFB laser.

The stack 18 has a thickness of approximately 140 nm. It can e.g. consist of a 20 nm thick GaInAsP layer with a v composition in In and w composition in P of respectively 0.75 and 0.5 and two 60 nm thick InP layers.

This Bragg grating 18 optionally supports a layer 20 protecting the active zone and made from p-type InP with a thickness of 0.01 to 0.2 μm and a doping ion (zinc) concentration of $5.10^{17}$ ions/cm$^3$.

The active layer 16, the Bragg grating layer 18 and the protective layer 20 are etched in order to form a ribbon 22 of width 1 between 1 and 3 μm constituting the active zone of the laser. The active ribbon 22 is covered by a p-type (zinc doping) InP layer 24 constituting the upper confinement layer.

With a view to the lateral confinement of light, the confinement layer 24 has on either side of the active zone 22, zones 25 obtained by proton implantation.

Thus, there is a p+-type $Ga_{1-f}In_fAs$ contact layer 26 with $0 \leq f \leq 1$ and a metal coating 28 supported by the contact layer 26. The metal coating 28 is a TiPt alloy, recharged with gold and having a thickness of 150 nm. The contact layer e.g. has an indium composition f of 0.53, a thickness of 200 nm and a p-dopant concentration of $5 \times 10^{18}$ to $2 \times 10^{19}$ ions/cm$^3$ and typically $1 \times 10^{19}$ ions/cm$^3$.

According to the invention, the laser structure shown in FIG. 1 differs from those of the prior art by a supplementary quaternary material layer 30 n-doped between $5 \times 10^{17}$ ions/cm$^3$ and $5 \times 10^{18}$ ions/cm$^3$, which is e.g. of $Ga_{1-z}In_zAs_{1-t}P_t$ with $0 < z < 1$ and $0 < t < 1$ serving as a layer for stopping the diffusion of p-dopant ions (in this case zinc) from the upper confinement layer 24. The layer 30 protects the active layer 16.

The layer 30 e.g. has the same composition as the active layer 16 (i.e. z and t respectively equal to 0.6 and 0.1 for an emission at 1.5 μm and z and t respectively 0.75 and 0.5 for an emission at 1.3 μm) and also forms part of the active zone 22 of the laser. Under these conditions, the layer 30 is also in the form of a ribbon of width 1. Moreover, the thickness of said supplementary layer 30 is less than that of the active layer 16 and is typically 15 nm thick.

Moreover, according to the invention, the upper confinement layer 24 is p-doped with a doping exceeding $1 \times 10^{18}$ ions/cm$^3$ and e.g. between $1 \times 10^{18}$ and $1 \times 10^{19}$ ions/cm$^3$, said doping typically being $2 \times 10^{18}$ ions/cm$^3$. The layer 24 also has a thickness of 1500 nm.

An evaluation of the series resistance of the BRS structure according to the invention leads to a series resistance value below 2 ohms for a device length L, measured in a direction perpendicular to 1 of 250 μm, i.e. 2 to 5 times less than that of optimized laser structures.

The statistical and dynamic performance characteristics of the device according to the invention are maintained or even improved compared with those of the prior art.

The Applicant has carried out various tests and research to verify the essential facts of the invention on the operation of the laser structure, i.e. that of blocking the diffusion of zinc ions by a n-doped $Ga_{1-z}In_zAs_{1-t}P_t$ stopping layer, between the $Ga_{1-x}In_xAs_{1-y}P_y$ of the active layer and the p-type InP of the upper confinement layer 24.

The mechanism of the diffusion is described by the Applicant in Japanese Journal of Applied Physics, Vol. 25, No. 8, August 1986, pp. 1169 to 1173, by K. Kazmierski and B. de Cremoux "A simple model and calculation of the influence of doping and intrinsic concentrations on the interstitial-substitutional diffusion mechanism: Application to Zn and Cd in InP".

The diffusion of acceptors is accelerated in the presence of holes (p-type material) or decelerated in the presence of electrons (n-type material) a total stoppage of diffusion occurring if the n-dopant concentration exceeds that of the p-acceptors. Moreover, this diffusion is slowed down in GaInAsP materials having a composition varying from InP towards GaInAs.

The two phenomena act jointly and it is possible to adjust the thickness of the blocking layer 30 to very small values, e.g. below 20 nm and typically 5 to 15 nm.

Another important aspect of the invention relates to the leakage of current through the parasitic p-n InP junction as a result of the strong p-doping of the layer 24 and the BRS structure.

The leakage current is dependent on the direct polarization voltage variation applied to the electrodes for a given current between the active junction and the homojunction. A direct voltage increase for a more complex active diode could eliminate this variation.

The Applicant has found that the direct polarization voltage of an active diode according to the invention with the strongly n-doped, supplementary quaternary layer, is not increased compared with the case when said layer is absent. The results are given in FIG. 2.

Figure 2:
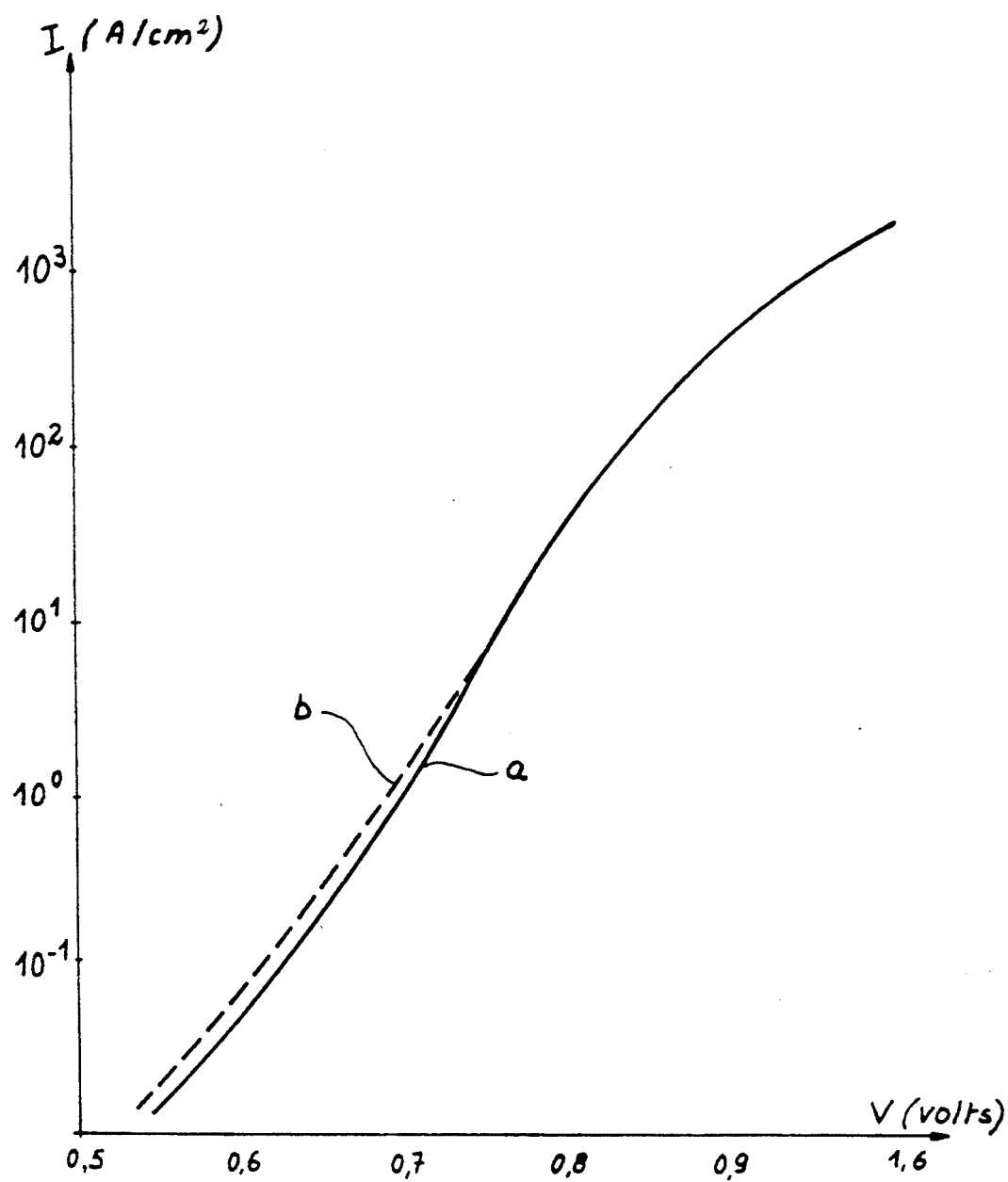
FIG. 2, a graph giving the variations of the current density, in amperes/cm$^2$, as a function of the voltage in volt applied to heterojunction diodes with or without a supplementary quaternary layer.

FIG. 2 gives the current-voltage characteristics of two heterojunction diodes with and without a supplementary quaternary layer. These diodes have an upper confinement layer p-doped at $2 \times 10^{18}$ ions/cm$^3$, a lower, InP confinement layer doped to $1 \times 10^{18}$ ions/cm$^3$ with a n-dopant and a not intentionally doped, active $Ga_{1-x}In_xAs_{1-y}P_y$ layer with x 0.75 and y 0.50.

The curves a and b respectively give the variations of the current density I, in A/cm$^2$, as a function of the voltage V for a diode having a supplementary, quaternary $Ga_{1-z}In_zAs_{1-t}P_t$ layer with z 0.75 and t 0.50, which is n+-doped to $1.10^{18}$ ions/cm$^3$, between the active layer and the p-doped InP layer and for a diode not having said supplementary layer.

The laser structure according to the invention is intended to be produced in two epitaxy stages. The process for the production of the laser structure of FIG. 1 is shown in FIGS. 3a to 3c.

Figure 3A:
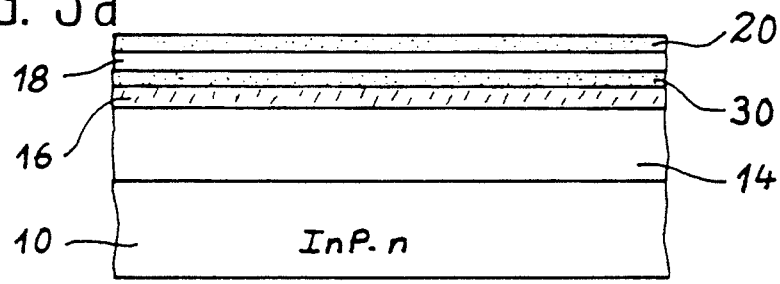
FIGS. 3a to 3c, diagrammatically the different stages in the production of a laser structure according to the invention.

In a first epitaxy cycle and with reference to FIG. 3a, deposition takes place in accordance with the chemical vapor deposition method, using metalorganics (MOVPE) on a n-type InP substrate 10 of a type n, InP buffer layer 14 and a layer 16, which is e.g. of $Ga_{1-x}In_x As_{1-y}P_y$, which is not intentionally doped and with x and y as given hereinbefore for emitting in the range 1.3 or 1.5 μm, the $Ga_{1-z}In_zAs_{1-t}P_t$ diffusion stopping layer 30 having the same composition of the layer 16, n-doped to $1 \times 10^{18}$ silicon ion/cm$^3$, the Bragg grating layer 18 and the p-type, InP protective layer 20.

Figure 3B:
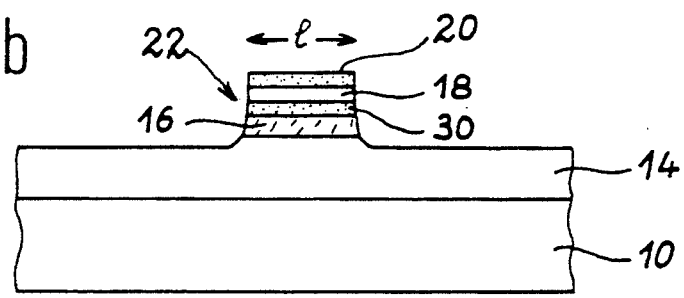
Figure 3C:
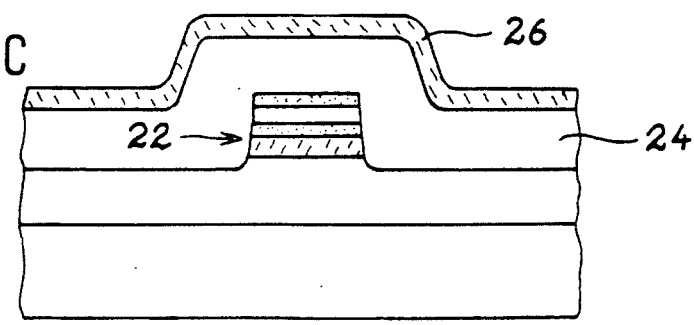

As shown in FIG. 3b, this is followed by an etching of the layers 16,18,30 and 20 in order to obtain the active ribbon 22 of width 1. This etching takes place in accordance with the preferred crystallographic directions, e.g. in direction <110> or <110> Chemical etching processes are used and HBr:Br constitutes the etching agent.

However, it is also possible to perform the etching operations dry using reactive ion etching or ion machining, as is known to the Expert.

As shown in FIG. 3c, this is followed by a second MOVPE epitaxy cycle in order to grow the p+-doped, InP layers 24 and the p+-doped, $Ga_{1-j}In_jAs$ contact layer 26.

The upper electrode 28 is then produced on the layer 26 using the gold-recharged TiPt metallization deposit. The lower TiAu electrode 12 is deposited on the face 11 of the InP substrate. This is followed by an ion implantation of protons 25 on either side of the laser ribbon 22, making the p-type, InP layer 24 semi-insulating in the regions 25, in order to electrically insulate the laser ribbon from the remainder of the structure.

This is followed by a cleaving of the structure in a direction perpendicular to the laser ribbon 22, in order to produce two semireflecting mirrors.

A series resistance of 1.5 ohm was obtained with this construction having a threshold current of 15 mA and a maximum optical power exceeding 40 mW (max. 90 mW) per face for a device length of 250 μm.

These excellent static characteristics prove the efficiency of high doping and the blocking of the diffusion of p-dopants into the active layer in the structure according to the invention.

The RC product of this construction (i.e. BRS laser with a length of 250 μm and untreated mirrors) was measured using an electrical network analyser. On the basis of the analysis of the corresponding Smith diagram, an equivalent RC diagram of the structure was deduced. The RC value of the structure according to the invention (i.e. 1.5 ohm×5 pF), in low and high frequency is lower than 8 ps, which corresponds to a passband limit better than 20 GHz.

The passbands effectively measured on the components exceed 16 GHz with a maximum exceeding 18 GHz. They are higher than those of the prior art BRS laser devices.

We claim:

1. An optoelectronic device having a III-V substrate (10), a lower, n-doped III-V material semiconductor confinement layer (14) in contact with the substrate (10), an active zone (22) having at least one not intentionally doped III-V material semiconductor active layer (16) located on the lower confinement layer (14), an upper, p-doped III-V material semiconductor confinement layer (24) covering the active zone, the forbidden energy band gap of the active layer being below that of the confinement layers, a first metal coating (28) placed on the upper confinement layer and a second metal coating (12) placed on the substrate, said device being characterized in that it comprises, between the active layer and the upper confinement layer a strongly n-doped, quaternary III-V material semiconductor stopping layer (30) stopping the diffusion of doping ions from the upper confinement layer, said stopping layer (30) having a thickness smaller than that of the active layer and also forming part of the active zone.

2. The device according to claim 1, characterized in that the quaternary layer (30) is doped at a donor ion concentration equal to or higher than that of the acceptor ions of the upper confinement layer.

3. The device according to claim 1, characterized in that the quaternary layer is doped with a doping donor ion concentration of $5 \times 10^{17}$ to $5 \times 10^{18}$ ions/cm$^3$.

4. The device according to claim 1, characterized in that the quaternary layer (30) has a composition identical to one of the layers forming the active layer.

5. The device according to claim 1, characterized in that the upper confinement layer (24) is doped to at least $10^{18}$ doping acceptor ions/cm$^3$.

6. The device according to claim 1, characterized in that a layer (20) protecting the active zone is provided between the upper confinement layer and the lower confinement layer.

7. The device according to claim 1, characterized in that the substrate is of InP, the lower confinement layer (14) of n-doped InP, the active layer (16) is of $Ga_{1-x}In_xAs_{1-y}P_y$, with $0 \leq x \leq 1$ and $0 \leq y \leq 1$, which is not intentionally doped, the upper confinement layer (24) is of p+-doped InP and the diffusion stopping layer (30) is of $Ga_{1-z}In_zAs_{1-t}P_t$ with $0 < z < 1$ and $0 < t < 1$, which is n-doped to a concentration of $5 \times 10^{17}$ to $5 \times 10^{18}$ ions/cm$^3$.

8. The device according to claim 1, characterized in that the active zone (22) is in the form of a ribbon surrounded by the upper confinement layer (24).

* * * * *